US009799419B2

(12) United States Patent
Cabauy et al.

(10) Patent No.: US 9,799,419 B2

(45) Date of Patent: *Oct. 24, 2017

(54) TRITIUM DIRECT CONVERSION SEMICONDUCTOR DEVICE FOR USE WITH GALLIUM ARSENIDE OR GERMANIUM SUBSTRATES

(71) Applicant: City Labs, Inc., Homestead, FL (US)

(72) Inventors: Peter Cabauy, Miami, FL (US); Larry C Olsen, Kennewick, WA (US); Noren Pan, Wilmette, IL (US)

(73) Assignee: City Labs, Inc., Homestead, FL (US)

( * ) Notice: Subject to any disclaimer, the term of this patent is extended or adjusted under 35 U.S.C. 154(b) by 195 days.

This patent is subject to a terminal disclaimer.

(21) Appl. No.: 14/623,861

(22) Filed: Feb. 17, 2015

(65) Prior Publication Data

US 2015/0310952 A1 Oct. 29, 2015

Related U.S. Application Data

(60) Provisional application No. 61/940,571, filed on Feb. 17, 2014.

(51) Int. Cl.
*H01L 31/02* (2006.01)
*G21H 1/06* (2006.01)

(52) U.S. Cl.
CPC .................................... *G21H 1/06* (2013.01)

(58) Field of Classification Search
CPC ..... G21H 1/16; H01L 31/04; H01L 31/02046; H01L 31/0687; H01L 31/1844; H01L 31/022425
See application file for complete search history.

(56) References Cited

U.S. PATENT DOCUMENTS

| | | | |
|---|---|---|---|
| 2,745,973 | A | 5/1956 | Rappaport |
| 2,976,433 | A | 4/1961 | Rappaport |
| 2,998,550 | A | 8/1961 | Collins et al. |
| 3,278,811 | A | 10/1966 | Mori |
| 3,714,474 | A | 1/1973 | Hoff, Jr. |
| 4,020,003 | A | 4/1977 | Steinberg |
| 4,158,286 | A | 6/1979 | Reinberg |
| 4,275,405 | A | 6/1981 | Shannon |

(Continued)

FOREIGN PATENT DOCUMENTS

| | | |
|---|---|---|
| EP | 1209549 | 5/2002 |

OTHER PUBLICATIONS

V.M. Andreev, et al, "Tritium-powered betacells based on AlxGA1-xAs" IEEE p. 1253-1256, 2000.

(Continued)

*Primary Examiner* — Phuc Dang

(74) *Attorney, Agent, or Firm* — John L. DeAngelis; Beusse, Wolter, Sanks & Maire, PLLC

(57) ABSTRACT

A device for producing electricity. In one embodiment the device comprises a germanium substrate doped a first dopant type and a plurality of stacked material layers above the substrate. These stacked material layers further comprise an InGaP base layer doped the first dopant type, an InGaP emitter layer doped the second dopant type, a window layer having a lattice structure matched to the lattice structure of the emitter layer and doped the second dopant type and a beta particle source for generating beta particles.

18 Claims, 5 Drawing Sheets

(56) References Cited

U.S. PATENT DOCUMENTS

| | | | |
|---|---|---|---|
| 4,291,815 | A | 9/1981 | Gordon |
| 5,260,621 | A | 11/1993 | Little |
| 5,642,014 | A | 6/1997 | Hillenius |
| 5,777,462 | A | 7/1998 | Yue |
| 5,859,484 | A | 1/1999 | Mannik |
| 6,118,204 | A | 9/2000 | Brown |
| 6,238,812 | B1 | 5/2001 | Brown et al. |
| 6,281,426 | B1 | 8/2001 | Olson et al. |
| 6,407,929 | B1 | 6/2002 | Hale et al. |
| 6,479,919 | B1 | 11/2002 | Aselage et al. |
| 6,660,928 | B1 | 12/2003 | Patton |
| 6,744,078 | B2 | 6/2004 | Fukuhara |
| 6,798,177 | B1 | 9/2004 | Liu |
| 6,949,865 | B2 | 9/2005 | Gadeken |
| 6,970,362 | B1 | 11/2005 | Chakravorty |
| 6,998,692 | B2 | 2/2006 | Sanchez |
| 7,122,733 | B2 | 10/2006 | Narayanan |
| 7,154,760 | B2 | 12/2006 | Konishi |
| 7,250,323 | B2 | 7/2007 | Gadeken |
| 7,301,254 | B1 | 11/2007 | Lal et al. |
| 7,336,509 | B2 | 2/2008 | Tallam |
| 7,411,283 | B2 | 8/2008 | Kockanson |
| 7,663,288 | B2 | 2/2010 | Chandrashekhar |
| 7,939,986 | B2 | 5/2011 | Chandrashekhar et al. |
| 8,017,412 | B2 | 9/2011 | Spencer et al. |
| 8,134,216 | B2 | 3/2012 | Spencer |
| 8,153,453 | B2 | 4/2012 | Spencer et al. |
| 8,487,507 | B1 * | 7/2013 | Cabauy .................... G21H 1/06 310/301 |
| 2003/0145884 | A1 * | 8/2003 | King ................. H01L 31/02168 136/255 |
| 2004/0154656 | A1 | 8/2004 | Weaver |
| 2006/0061922 | A1 | 3/2006 | Mihai |
| 2006/0185725 | A1 * | 8/2006 | Fatemi .............. H01L 31/03046 136/255 |
| 2007/0080605 | A1 | 4/2007 | Chandrashekhar et al. |
| 2008/0257409 | A1 * | 10/2008 | Li ....................... H01L 31/1852 136/259 |
| 2011/0031572 | A1 | 2/2011 | Spencer et al. |
| 2011/0079791 | A1 | 4/2011 | Chandrashekhar et al. |
| 2011/0086456 | A1 | 4/2011 | Spencer et al. |
| 2011/0114171 | A1 * | 5/2011 | Meier ............... H01L 31/02168 136/256 |
| 2011/0186115 | A1 * | 8/2011 | Wanlass ............ H01L 31/06875 136/255 |
| 2011/0241144 | A1 | 10/2011 | Spencer et al. |
| 2011/0287567 | A1 | 11/2011 | Spencer et al. |
| 2011/0298071 | A9 | 12/2011 | Spencer et al. |
| 2012/0133244 | A1 | 5/2012 | Spencer et al. |
| 2012/0149142 | A1 | 6/2012 | Spencer et al. |
| 2013/0074934 | A1 * | 3/2013 | Liu ................... H01L 31/03046 136/262 |
| 2013/0278109 | A1 * | 10/2013 | Zafiropoulo ............. G21H 1/02 310/303 |

OTHER PUBLICATIONS

FK. Manase et al. "Schottky Barrier Betavoltaic Battery" IEEE Transactios on Nuclear Science, vol NS-23, No. 1, pp. 860-870, Feb. 1976.

T. Kosteski, et al. "Tritiated Amorphous Silicon Betavoltaic Devices" IEEE Proceedings on Circuits, Devices & Systems, vol. 150, No. 4, pp. 274-281, Aug. 2003.

C. Hosberg et al. "GaN Betavoltaic Energy Converters" 31St IEEE Photovoltaics Specialist Conference, Jan. 2005.

Bower, Barbanel, Shreter, Bohnert; Reference book entitled Polymers Phosphors, Voltaics Radioisotope Microbatteries, Published by CRC Press, LLC, 2000 Corporate Bolevard NW, Boca Raton, FL 33431, USA; Copyright 2002, pp. 15-27.

L.C. Olsen, "Betavoltaic Energy Conversion", Energy Conversion vol. 13, pp. 117-127, Pergomon Press.

L.C. Olsen, "Review of Betavoltaic Energy Conversion" In NASA Lewis Research Center, Proceedings of the 12th Space Photovoltaic Resrearch Center, Proceedings of the 12 Space Photovoltaic Research and Technology Conference (SPRAT 12) pp. 256-267.

* cited by examiner

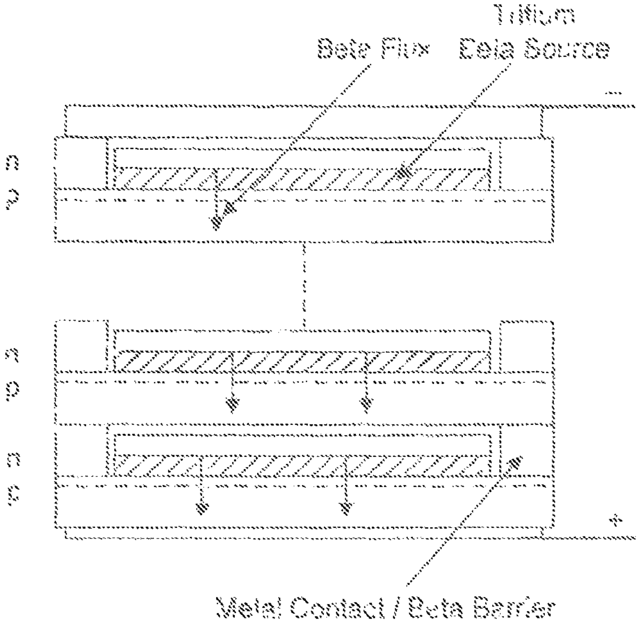
FIG. 4
Figure 5A
Figure 5B
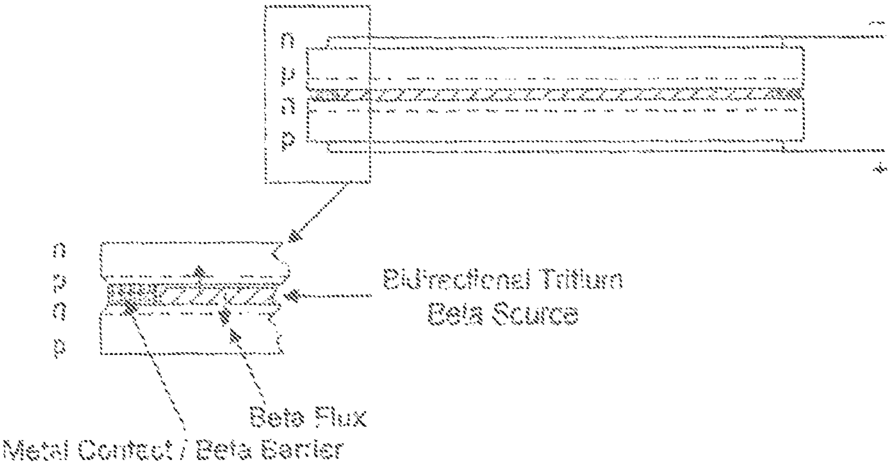

Figure 6A
Figure 6B
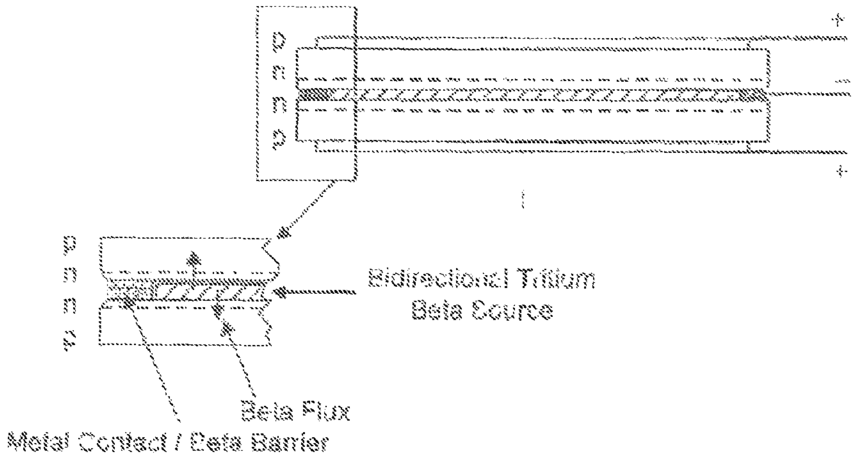
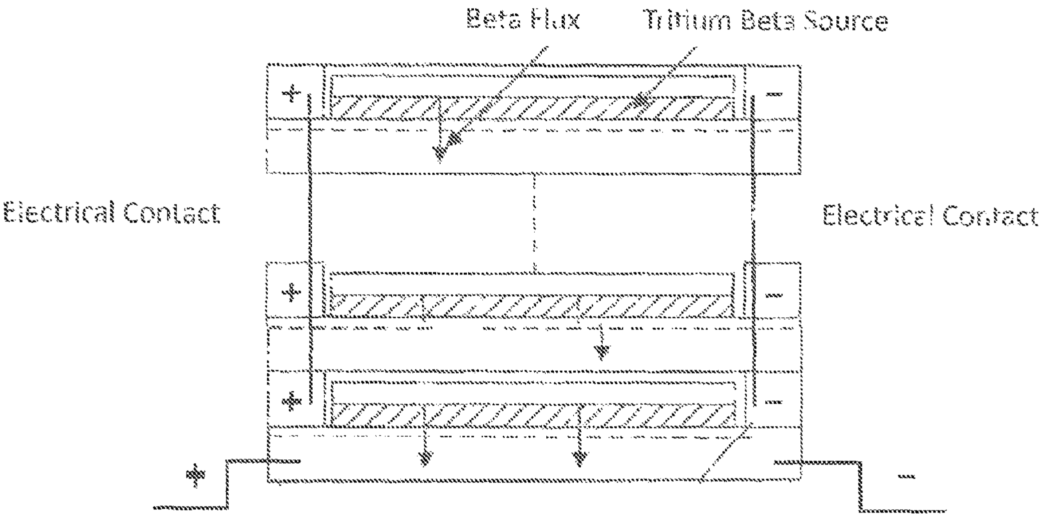
FIG. 7

TRITIUM DIRECT CONVERSION SEMICONDUCTOR DEVICE FOR USE WITH GALLIUM ARSENIDE OR GERMANIUM SUBSTRATES

RELATED APPLICATION

This application claims priority based on U.S. Provisional Patent Application Ser. No. 61/940,571 filed Feb. 17, 2014.

BACKGROUND OF THE INVENTION

The direct conversion of radioisotope beta (electron) emissions into usable electrical power via beta emissions directly impinging on a semiconductor junction device was first proposed in the 1950's. Incident beta particles absorbed in a semiconductor create electron-hole-pairs (EHPs) which are accelerated by the built-in field to device terminals, and result in a current supplied to a load resistor. These devices are known as Direct Conversion Semiconductor Devices, Beta Cells, Betavoltaic Devices, Betavoltaic Batteries, Isotope Batteries etc. These direct conversion devices promise to deliver consistent long-term battery power for years and even decades. For this reason, many attempts have been made to commercialize such a device. However, in the hopes of achieving reasonable power levels, the radioisotope of choice often emitted unsafe amounts of high energy radiation that would either quickly degrade semiconductor device properties within the betavoltaic battery or the surrounding electronic devices powered by the battery. The radiated energy may also be harmful to operators in the vicinity of the battery.

As a result of these disadvantages and in an effort to gain approval from nuclear regulatory agencies for these types of batteries, the choice for radioisotopes has been limited to low-energy beta (electron) emitting radioisotopes, such as nickel-63, promethium-147 or tritium. Due to the fact that promethium-147 is regulated more stringently and requires considerable shielding and nickel-63 has a relatively low beta flux, tritium has emerged as a leading candidate for such a battery device.

Tritium betavoltaic batteries, sometimes referred to as tritium betavoltaic devices or tritium direct conversion devices, have been promoted during the last thirty years. Tritium is a relatively benign radioisotope with low beta energy emission that can easily be shielded with as little as a thin sheet of paper. Tritium has a long track record in commercial use in illumination devices such as EXIT signs in commercial aircraft, stores, school buildings and theatres. It is also widely used in gun sights and watch dials, making it an ideal power source for the direct conversion devices. Unfortunately, tritium's beta emissions are so low in energy that it is has been difficult to efficiently convert it into usable electrical power for even the most low power applications, such as powering SRAM memory to prevent the loss of stored data.

Several attempts have been made to produce useful current from a tritium betavoltaic battery. For example, polycrystalline or amorphous semiconductor devices have been considered for tritium betavoltaic batteries based on the assumption that such devices would allow batteries to be fabricated at a reduced cost. It is assumed that these devices could be manufactured in a thin-film like fashion and that tritium could be embedded within the polycrystalline or amorphous devices. However, this approach is extremely inefficient (much less than 1%) with respect to the beta energy emissions entering the semiconductor. The main reason for this low semiconductor conversion efficiency is the high dark current or leakage current of the semiconductor that acts as a negative current. This high dark current competes with the betavoltaic current produced by collection of EHPs created via the tritium beta particles impinging on the semiconductor. In short, the polycrystalline and amorphous semiconductors have a high number of defects resulting in recombination centers for the EHPs, which in turn significantly reduce the betavoltaic current and lead to very low efficiency for the battery.

The best results for tritium betavoltaics have been achieved with single crystal semiconductor devices. Recent attempts have involved single crystalline semiconductor devices with a tritium source such as a tritiated polymer, aerogel or tritiated metal hydride placed in direct contact with a semiconductor junction device. Single crystalline semiconductors have longer carrier lifetimes and fewer defects resulting in much lower dark currents. To date, the highest reported efficiencies for tritium betavoltaic batteries were published in a reference text entitled: "Polymers, Phosphors and Voltaics for Radioisotope Microbatteries" edited by K. Bower et al. Single crystal semiconductor devices were exposed to tritium metal hydride sources on top of the semiconductors. Several homojunction semiconductor cells were utilized with the following results:

Silicon Cells:
Short Circuit Current=18.1 nA/cm^2
Open Circuit Voltage=0.162
Fill Factor=0.513
Tritiated Titanium Source=0.23 microwatts/cm^2
Efficiency=1.3%
Aluminum Gallium Arsenide (AlGaAs) Cells:
Short Circuit Current=58 nA/cm^2
Open Circuit Voltage=0.62
Fill Factor=0.751,
Power=27 nW/cm^2
Tritiated Titanium Source=0.48 microwatts/cm^2,
Efficiency=5.6%

Silicon cells are a preferred choice due to their low cost. However, their low efficiency makes them a poor choice for even the most low power applications, such as SRAM memory devices. The performance of the AlGaAs homojunction cell is attractive with one of the highest reported efficiencies and would be suitable for powering an SRAM memory device through the stacking of tritiated metal hydride layers and AlGaAs homojunction cells. However, AlGaAs homojunctions cells are difficult to reproduce consistently with uniform dark currents across a semiconductor device due to the oxidation of the aluminum. As a result, AlGaAs is also an expensive option to scale up.

Safety concerns over containment of the tritium based betavoltaic battery have emerged as another obstacle to commercialization of a tritium battery. In commercially available products such as tritium illumination devices (e.g. EXIT signs, gun sights and watch dials), the tritium is in gaseous form and contained within a glass vial. Many accidents involving tritium release due to the breakage of the tritium vials in EXIT signs have caused public concerns and resulted in costly clean-up operations.

In the case of a tritium betavoltaic battery utilizing solid-state tritium metal hydride sources the risk for exposure is lower compared to gaseous tritium devices. However, the tritium metal hydride still involves a miniscule amount of tritium release when open to the environment at room temperature. Although several tritium based batteries have been proposed including direct conversion devices built within an integrated circuit, a method of effectively hermetically packaging the battery containing the tritium metal hydride has yet to be proposed.

A major obstacle to hermetically sealing this type of battery is the risk associated with using a sealing process that involves high temperatures, i.e., above 200-300° C., where tritium is released from the metal hydride causing failure of the battery after sealing or worse, causing tritium exposure at the manufacturing facility and to the operator of the equipment for sealing the battery.

In addition to the above listed obstacles, the texturing of a direct conversion semiconductor device to increase the surface area exposed to radiation emission has been proposed several times in the past. For example, on page 282 of the book entitled "Polymers, Phosphors and Voltaics for Radioisotope Microbatteries" edited by K. Bower et al., the use of porous silicon and tritium inserted into porous silicon holes was proposed as a means of increasing the surface area of the semiconductor device by 20 to 50 times, in contrast to the original planar semiconductor surface area.

The following published patent applications and patents each propose a method of increasing the surface area of the semiconductor by textured growth of the semiconductor or a post-growth texturing method:

US Patent Application Publication 2004/0154656

US Patent Application Publication 2007/0080605

U.S. Pat. No. 7,250,323

U.S. Pat. No. 6,949,865

Central to this approach is the hope that an increase in surface area exposed to radioisotope emissions will increase the power per unit volume of the direct conversion semiconductor device. The overall goal of this approach is to not only reduce the size of the direct conversion device but also to potentially reduce the cost associated with producing the equivalent surface area in a planar semiconductor device.

The problem with such an approach arises when a relatively low energy radioisotope such as tritium is used. In this case, the incident power is quite small per unit area exposed and the dark current of the semiconductor device is a very significant factor in the overall efficiency of the device. For this reason, it is preferable to use single crystal semiconductors where device defects are minimized and the dark current is sufficiently low so that power can be produced efficiently.

Unfortunately, alterations to the semiconductor surface, as proposed above, risk increasing lattice defects, resulting in a high number of recombination centers for EHPs. This creates a direct conversion semiconductor device with a low open circuit voltage and reduced short circuit current resulting in a low overall efficiency.

BRIEF DESCRIPTION OF THE DRAWINGS

The present invention can be more easily understood and the advantages and uses thereof more readily apparent when the detailed description of the present invention is read in conjunction with the figures wherein:

FIG. 4 illustrates one embodiment for stacking a plurality of n/p (or p/n) cells in series using unidirectional beta sources.

FIGS. 5A and 5B illustrate a series connection of a p/n and an n/p cell.

FIGS. 6A and 6B illustrate an embodiment for stacking a plurality of n/p (or p/n) cells in parallel with bi-directional beta sources.

FIG. 7 illustrates a parallel connection of units that are stacked vertically comprised of uni- or bi-directional beta sources.

In accordance with common practice, the various described features are not drawn to scale, but are drawn to emphasize specific features relevant to the invention. Like reference characters denote like elements throughout the figures and text.

DETAILED DESCRIPTION OF THE INVENTION

Before describing in detail the particular methods and apparatuses related to tritium direct conversion semiconductor devices, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

The present invention relates to a tritium direct conversion semiconductor device comprised of a single crystal semiconductor and a device structure with both a low dark current and high efficiency for power conversion of tritium's beta emissions into electrical power. It should be understood that the high efficiency and longevity (e.g. over 10 years) of the various device structure embodiments are suitable for use with other candidate radioisotopes for betavoltaic operations (e.g., promethium-147 and nickel-63).

Figure 1:
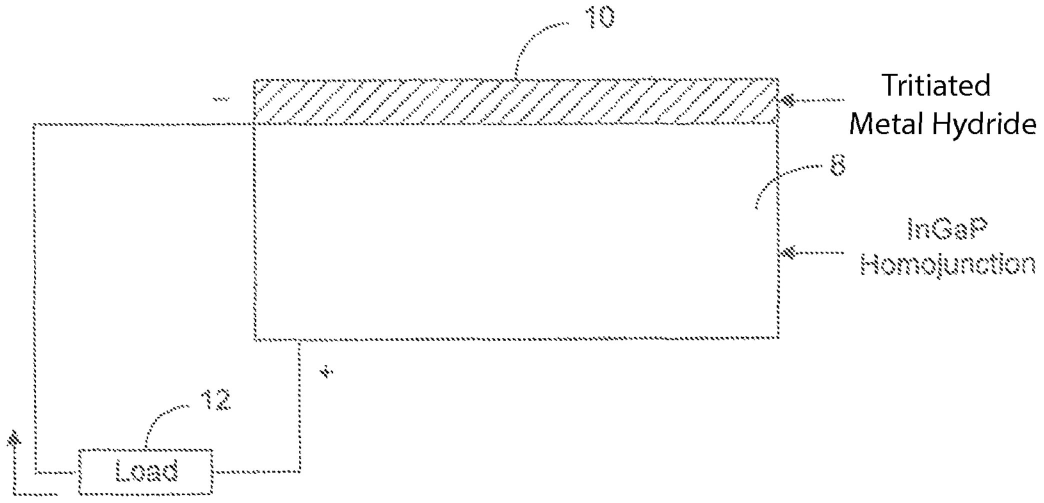
FIG. 1 is a representation of an InGaP homojunction in contact with a tritiated scandium source connected to a load.

One embodiment of the present invention proposes a novel use of Indium Gallium Phosphide homojunction semiconductor 8 in conjunction with a tritiated metal hydride source 10, as illustrated in FIG. 1, for supplying power to a load 12. The tritiated metal hydride source (e.g., scandium tritide, titanium tritide, palladium tritide, magnesium tritide, lithium tritide, or any combination thereof etc.) is directly in contact with the semiconductor to generate electrical power at an efficiency of 7.5% or higher with respect to the beta electrons impinging on the Indium Gallium Phosphide homojunction. InGaP is one of the larger band gap materials and has only recently been used in a tritium based direct conversion battery.

One embodiment uses a composition of the Indium Gallium Phosphide homojunction comprising $In_{0.49}Ga_{0.51}P$ (subsequently referred to as InGaP). The band gap of this semiconductor is 1.9 eV and the materials production technology is well developed by the solar cell industry. The technology also lends itself to high quality growth with a low density of lattice defects and low dark current characteristics. In addition, InGaP may be mass produced with a high yield due to its manufacturing process maturity, thus lowering the cost of tritium betavoltaic batteries based on InGaP. InGaP device structures are grown by metal-organic-vapor-deposition (MOCVD) as is known by those skilled in the art.

Figure 2:
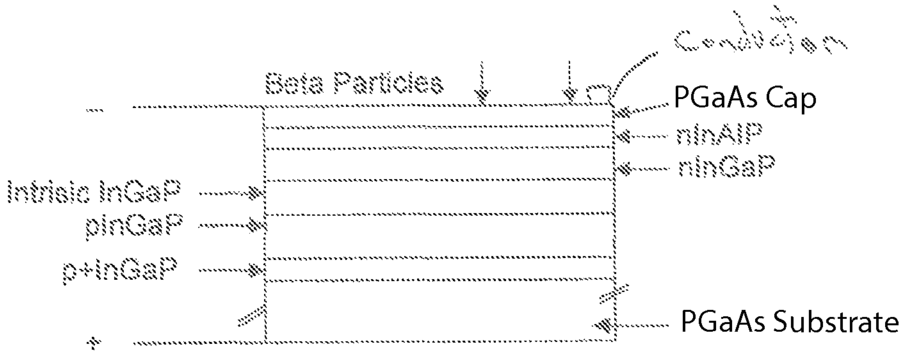
FIG. 2 illustrates a physical structure of an InGaP homojunction device for tritium betavoltaic conversion.
Figure 3:
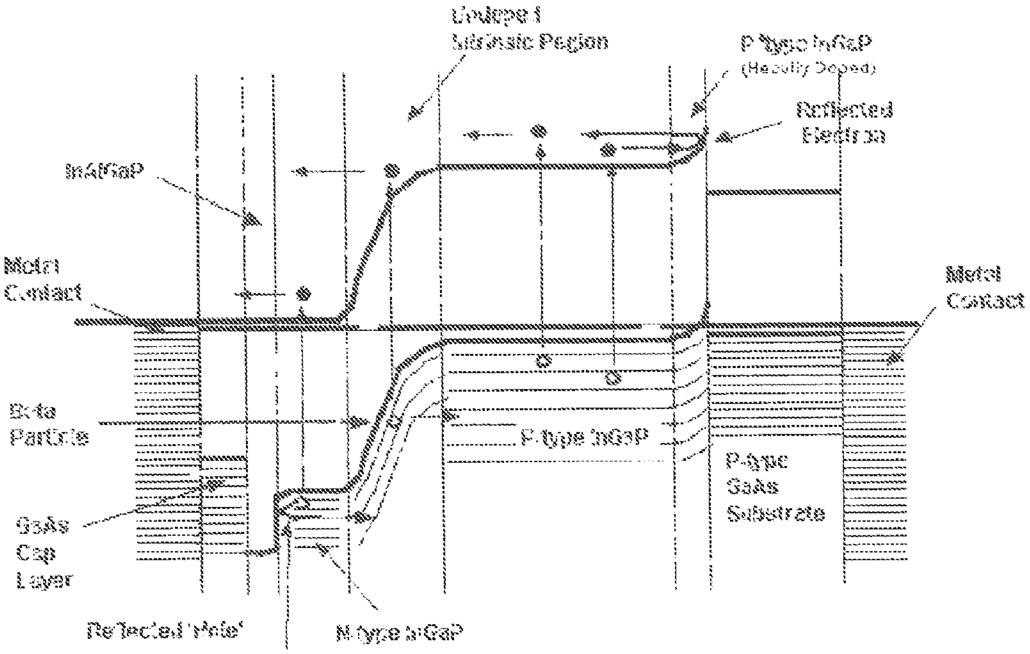
FIG. 3 is an electron band diagram for an InGaP device

The description of this embodiment presents novel and non-obvious features that allow efficient conversion of tritium beta flux to electrical power. FIGS. 2 and 3 illustrate the physical structure and electron band diagram, respectively. Each layer has the same lattice constant as the GaAs substrate so that the number of dislocations generated by growth of the individual layers is minimized. The beta particles represented by arrowheads in FIG. 2 are released by the tritiated scandium material of FIG. 1.

FIG. 2 illustrates the individual layers of the n/p homojunction semiconductor 8, comprising, from the bottom:

- a pGaAs substrate (notation for a p type GaAs substrate)
- a pGaAs layer (grown to establish crystal structure)
- a p+InGaP layer (a back surface field or minority carrier reflector)
- a pInGaP layer (base)
- an intrinsic InGaP layer (for preventing diffusion of dopants between the p-doped and n-doped layers)
- an nInGaP layer (emitter)
- an nInAlP layer (window layer closely matched to the nInGaP and cap layers that allows electrons to pass to the cap layer and reflects holes back to the emitter)
- an nGaAs cap layer (may be highly doped)

If the dopant types are reversed from those set forth above, the structure may be referred to as a p/n homojunction semiconductor.

There are several features of this structure that allow efficient betavoltaic energy conversion:

(a) High quality, large band gap semiconductor junction resulting in a highly efficient device;

(b) Back-surface field that reflects electrons back onto the junction field with a highly doped $p^+$InGaP layer (can also be created by p-type InAlP or InAlGaP or ZnSe);

(c) A lattice-matched n-type InAlP window layer to reflects holes back to the emitter leading to a low dark current (can also be created with a highly doped n+InAlGaP, ZnSe, AlAs, n+InGaP or AlAsP);

(d) A GaAs Cap layer of about a few hundred angstroms or less covering the top surface; and (e) a 1000 to 3000 Å layer of intrinsic InGaP to act as a buffer to diffusion of the p type dopant (usually Zn) into the n-type emitter region.

The features (a), (b) and (c) may be important for solar cell operation but their utilization in tritium betavoltaic application is considered novel in the present embodiment. The novel features (d) and (e) may be important for betavoltaic conversion, but is not necessarily used for photovoltaic energy conversion. All of these features allow the achievement of the low dark currents required for efficient betavoltaic energy conversion. The novel lattice-matched InAlP window layer prevents the formation of dislocations at the InAlP-InGaP interface, which would increase the dark current. The GaAs cap layer keeps the InAlP layer from oxidizing, the absence of which could introduce defects for EHP recombination at the InAlP-InGaP region. This cap layer, therefore augments hole reflections at that interface. The GaAs cap layer does not absorb a significant percentage of the beta flux, and therefore can be tolerated. It should be noted that the cap layer can be made out of other III-V materials or combinations of III-V materials that can function in a similar capacity.

In another embodiment, the cap layer is about 50-100 Angstroms thick or less. According to this embodiment conductive gridlines are deposited on top of a thick (for example, about 3000 to 10000 Angstroms) cap layer and then the cap layer is removed by an etch process, except the cap layer material under the grid lines. To retain this cap layer material, the etch process can be timed so that about 50-100 Angstroms of cap layer material remains. Alternatively, an etch stop layer can be formed and located such that when the etchant reaches the etch stop layer about 50-100 Angstroms of cap layer material remains. In order to construct a thin 50-100 Angstrom cap layer for protection of the window a selective etch of the GaAs cap layer that stops at a thin InGaP layer may be used, leaving a thin layer of InGaP over the 50-100 Angstrom GaAs cap layer, and if desired, the InGaP layer may be selectively etched down to the GaAs cap layer.

In solar cell operation the GaAs cap layer is typically removed except under the metal gridline contacts. This is required since a cap layer across regions between the metal gridline contacts would reduce the efficiency of the solar cell due to significant absorption of the solar photons. For this reason, the GaAs cap layer is etched away completely in a solar cell, except for the regions under the gridline metal contacts. Since in solar cell operation the remaining GaAs cap layer under the metal gridline contacts is a conduit for the electrons to the grid metal lines, the GaAs cap layer is normally doped to a high level of 10^19 ND/cm^3 in order to create good conduction for milliamps or higher current levels required in photovoltaic operations.

High doping of the GaAs cap may unfortunately create defects in the n-type InAlP layer, which could increase the dark current. For betavoltaic operations, an increase in the dark current could cause a reduction of cell efficiency due to the high doping of this layer. This is not important for photovoltaic operations since the dark current is so low compared to the milliamp current levels generated in a solar cell photovoltaic operation, but it is extremely important for the betavoltaic operation where the current levels are in the range of nanoamps. For this reason, the novel application of a cap layer with reduced doping may be introduced. The betavoltaic GaAs cap layer doping may be reduced to a level of 10^18 ND/cm^3, or less, thereby reducing the number of defects that may result from diffusion of the GaAs Cap layer dopant into the n-type InAlP layer.

The novel intrinsic InGaP layer is not used in photovoltaic operation but may be important for betavoltaic operation due to the fact that it helps achieve low dark currents. All layers of the InGaP device structure are grown at high temperatures (e.g. 500° C.-700° C.). In particular, the intrinsic layer, the n-InGaP emitter layer, the n-InAlP layer and the n-GaAs cap layer are all grown at high temperatures. During the time required for growth of these layers, the p-type dopant zinc in the p-InGaP layer will diffuse toward the n-type films. If the intrinsic layer is too thin and allows zinc to diffuse into the emitter layer and the InAlP region, the dark current will increase and the betavoltaic device performance is degraded. Thus, since low dark currents are critical for tritium betavoltaic energy conversion, the intrinsic layer must be thick enough to be an effective buffer to zinc diffusion. An intrinsic layer of approximately 1000-3000 Angstroms or more is sufficient to produce a low dark current, betavoltaic device.

Although the present invention utilizes an intrinsic layer of InGaP that is 1000-3000 Å, it is also possible in one embodiment of the invention to remove the intrinsic layer or to use a substantially smaller intrinsic layer thickness of about e.g., 50-100 Å.

It should be noted that the tritium InGaP betavoltaic structure presents novel and non-obvious features that provide a low dark current and a high voltage and collection efficiency. The following data was obtained with solid tritiated metal hydride sources (e.g. titanium tritide, scandium tritide etc.) and have the highest reported efficiency of 7.5% with respect to the incident beta radiation impinging on the InGaP homojunction. In particular, for a tritiated scandium source with a 250 to 500 nanometer thick scandium film and an InGaP homojunction as shown in FIG. 2 the following results were achieved:

Short Circuit Current=45.2 nA/cm^2
Open Circuit Voltage=0.77
Fill Factor=0.79,
Power=27.5 nW/cm^2
Tritiated Scandium Source=0.369 microwatts/cm^2,
Efficiency=7.5%

In yet another embodiment the dopants may be reversed for all layers to produce a p/n structure. In particular, starting from the bottom:

a nGaAs substrate
a nGaAs layer (grown to establish crystal structure)
a n+InGaP layer (a back surface field or minority carrier reflector)
a nInGaP layer (base)
an intrinsic InGaP layer (for preventing diffusion of dopants between the p-doped and
n-doped layers)
an pInGaP layer (emitter)
an pInAlP layer (window layer closely matched to the pInGaP and cap layers) that allows holes to pass to the cap layer and reflects electrons back to the emitter)
a pGaAs cap layer (may be highly doped p-type)

In general the present invention demonstrates that the intrinsic layer in tritium betavoltaic devices serves three important purposes: (a) it acts as a buffer to diffusion of dopant atoms from the base region into the emitter region; (b) it allows efficient collection of electron-hole pairs produced as a result of beta particle absorption; and (c) as a consequence, the base region can be heavily doped so that the built-in voltage can be maximized. The high dopant density in the base region (with reference to FIG. 2, the pInGaP layer) is novel to the betavoltaic structure. This is due to the fact that it is not necessary to have a finite diffusion length in the base region for efficient carrier collection; hence a relatively high dopant density can be used in the base region to maximize the built-in potential. Minimizing diffusion of dopant atoms from the base to the emitter and window layers is desirable for achieving a low dark current. With EHPs mainly produced in the emitter and high field intrinsic region, a large collection efficiency can be achieved.

Tritium beta particle penetration in semiconductors is less than about one micron. Thus, it is clear that the emitter and window layers need to be very thin, preferably on the order of a few hundred Å so that most of the beta particle absorption occurs in the high field region in the depletion layer (with respect to FIG. 2, the intrinsic InGaP layer or in another embodiment a material region between a p-doped and an n-doped region). Homojunctions are typically formed by abruptly reducing one dopant (e.g., for n-type material) and immediately introducing the other dopant (e.g., for p-type material). The intrinsic regions formed in devices discussed herein are created by reducing one dopant input to zero followed by film growth with neither donors nor acceptors introduced to form the intrinsic layer, and then initiating introduction of the other dopant. Unless noted otherwise, in one embodiment all of the device structures considered herein have an intrinsic layer between the emitter (e.g., the nInGaP layer) and base region (the pInGaP layer). The thickness of the intrinsic layer is selected so that most of the beta particle absorption occurs in the emitter and intrinsic layers.

The basic approach to solar cell fabrication does not typically include the intentional formation of a relatively wide intrinsic layer. However, since the tritium betas are absorbed in a few thousand Angstroms, there is great flexibility regarding an increased doping density in the base.

In another embodiment, the betavoltaic structure may be alloyed with 1-3% Aluminum to achieve a slightly higher bandgap.

The various approaches based on GaAs substrates are summarized in Tables 1, 2 and 3. Included are structures based on materials that lattice match GaAs but have larger electron bandgaps, namely, In(AlGa)P and InAlP. It should be noted that several betavoltaic structure embodiments utilize tunnel junctions to serve as a means of changing the dominant carrier from electrons to holes, or vice versa. Two different types of layers are utilized in the tunnel junction structures. These tunnel junctions involve a heavily doped n-layer adjacent to a heavily doped p-layer, referred to as $n^{++}$ and $p^{++}$ layers, respectively. Thicknesses are typically 100 A for both the $n^{++}$ and $p^{++}$ layers although they can range from approximately 50 A to 200 A. The dopant levels are typically 5E18 to 1E19 cm-3 for Zinc in $p^{++}$ layers and similarly for Silicon doping in $n^{++}$ layers. Other features of various materials and layers are set forth in the reference notes provided with the Tables below.

TABLE 1

InGaP Cells on GaAs Substrates

| | p-GaAs Substrates | | n-GaAs Substrates | |
|---|---|---|---|---|
| | n/p InGaP | p/n InGaP | n/p InGaP | p/n InGaP |
| Layer 1 | p-GaAs Sub | p-GaAs Sub | n-GaAs Sub | n-GaAs Sub |
| Layer 2 | p-GaAs (Est Crs Struc) | p-GaAs (Est Crs Struc) | n-GaAs (Est Crs Struc) | n-GaAs (Est Crs Struc) |
| Layer 3 | p InAlP (Reflector) | p++GaAs (p-layer TJ) | n++GaAs (p-layer TJ) | n InAlP (Reflector) |
| Layer 4 | pInGaP (base) | n++GaAs (n-layer TJ) | p++GaAs (n-layer TJ) | nInGaP (base) |
| Layer 5 | InGaP (i-Layer) | nInAlP (Reflector) | pInAlP (Reflector) | InGaP (i-Layer) |
| Layer 6 | nInGaP (emitter) | nInGaP (base) | pInGaP (base) | pInGaP (emitter) |
| Layer 7 | nInAlP (Window) | InGaP (i-layer) | InGaP (i-layer) | pInAlP (Window) |
| Layer 8 | n++GaAs cap Layer | pInGaP (emitter) | nInGaP (emitter) | p++GaAs cap Layer |

TABLE 1-continued

| InGaP Cells on GaAs Substrates | | | | |
|---|---|---|---|---|
| | p-GaAs Substrates | | n-GaAs Substrates | |
| | n/p InGaP | p/n InGaP | n/p InGaP | p/n InGaP |
| Layer 9 | | pInAlP Window | nInAlP Window | |
| Layer 10 | | p++GaAs cap layer | n++GaAs cap layer | |

Notes:

1. Est Crs Struc refers to a layer to establish the crystal structure.
2. Tj designates tunnel junction.
3. InGaP refers to a compound In$x$Ga(1 − x)P, where x = 0.48, which lattice matches GaAs.
4. InAlP refers to a compound In$x$Al(1 − x), where x = 0.48, which lattice matches GaAs
5. P materials will typically be doped with about 1E17 cm−3 of Zn, p+ up to about 1E18 cm−3, whereas those designated as p++ may be doped to a level of about 5E18 cm−3 Zn.
6. N materials are doped with Si with the doping range also being in the range of about 1E17 cm−3 to 5E18 cm−3.
7. Reflector layer refers to layer at an interface between the base layer and the substrate that reflects minority carriers so that recombination losses are minimized.
8. Window layer refers to a layer adjacent the emitter that allows majority carriers pass to the cap layer and reflects minority carriers to minimize recombination losses.
9. The cap layer is heavily doped so that it is very conductive.

TABLE 2

| In(AlGa)P Cells on GaAs Substrates | | | | |
|---|---|---|---|---|
| | p-GaAs Substrates | | n-GaAs Substrates | |
| | n/p In(AlGa)P | p/n (AlGa)P | n/p (AlGa)P | p/n (AlGa)P |
| Layer 1 | p-GaAs Sub | p-GaAs Sub | n-GaAs Sub | n-GaAs Sub |
| Layer 2 | p-GaAs (Est Crs Struc) | p-GaAs (Est Crs Struc) | n-GaAs (Est Crs Struc) | n-GaAs (Est Crs Struc) |
| Layer 3 | p InAlP (Reflector) | p++GaAs (p-layer TJ) | n++GaAs (p-layer TJ) | n InAlP (Reflector) |
| Layer 4 | pIn(AlGa)P (base) | n++GaAs (n-layer TJ) | p++GaAs (n-layer TJ) | nIn(AlGa)P (base) |
| Layer 5 | In(AlGa)P (i-Layer) | nInAlP (Reflector) | pInAlP (Reflector) | InGaP (i-Layer) |
| Layer 6 | nIn(AlGa)P (emitter) | nIn(AlGa)P (base) | pIn(AlGa)P (base) | pIn(AlGa)P (emitter) |
| Layer 7 | nInAlP (Window) | In(AlGa)P (i-layer) | In(AlGa)P (i-layer) | pInAlP (Window) |
| Layer 8 | n++GaAs cap Layer | pIn(AlGa)P (emitter) | nIn(AlGa) P (emitter) | p++GaAs cap Layer |
| Layer 9 | | pInAlP Window | nInAlP Window | |
| Layer 10 | | p++GaAs cap layer | n++GaAs cap layer | |

Notes:
1. Est Crs Struc refers to a layer to establish the crystal structure.
2. Tj designates a tunnel junction.
3. InGaP refers to a compound In$x$Ga(1 − x)P, where x = 0.48, which lattice matches GaAs.
4. InAlP refers to a compound In$x$Al(1 − x), where x = 0.48, which lattice matches GaAs
5. In(AlGa)P refers a compound In$x$(Al$y$Ga(1 − y))(1 − x)P with x = 0.48 and y = 0.2.
6. P type materials will typically be doped with about 1E17 cm−3 of Zn, p+ up to about 1E18 cm−3, whereas those designated as p++ may be doped to a level of about 5E18 cm−3 Zn.
7. N type materials are doped with Si with the doping range also being in the range of about 1E17 cm−3 to about 5E18 cm−3.
8. A reflector layer refers to layer at an interface between the base layer and substrate that reflects minority carriers so that recombination losses are minimized.
9. A window layer refers to a layer adjacent the emitter that allows majority carriers pass to the cap layer and reflects minority carriers to minimize recombination losses.
10. The cap layer is heavily doped so that it is very conductive.

TABLE 3

| InAlP Cells on GaAs Substrates | | | | |
|---|---|---|---|---|
| | p-GaAs Substrates | | n-GaAs Substrates | |
| | n/p InAlP | p/n InAlP | n/p InAlP | p/n InAlP |
| Layer 1 | p-GaAs Sub | p-GaAs Sub | n-GaAs Sub | n-GaAs Sub |
| Layer 2 | p-GaAs (Est Crs Struc) | p-GaAs (Est Crs Struc) | n-GaAs (Est Crs Struc) | n-GaAs (Est Crs Struc) |
| Layer 3 | p+ InAlP (Reflector) | p++GaAs (p-layer TJ) | n++GaAs (p-layer TJ) | n+InAlP (Reflector) |
| Layer 4 | pInAlP (base) | n++GaAs (n-layer TJ) | p++GaAs (n-layer TJ) | nInAlP (base) |
| Layer 5 | InAlP (i-Layer) | n+InAlP (Reflector) | p+InAlP (Reflector) | InAlP (i-Layer) |
| Layer 6 | nIAlaP (emitter) | nInAlP (base) | pInAlP (base) | pInAlP (emitter) |
| Layer 7 | n+InAlP (Window) | InAlP (i-layer) | InAlP (i-layer) | p+InAlP (Window) |
| Layer 8 | n+GaAs cap Layer | pInAlP (emitter) | nInAlP (emitter) | p+GaAs cap Layer |

TABLE 3-continued

| InAlP Cells on GaAs Substrates | | | | |
|---|---|---|---|---|
| | p-GaAs Substrates | | n-GaAs Substrates | |
| | n/p InAlP | p/n InAlP | n/p InAlP | p/n InAlP |
| Layer 9 | | p+InAlP Window | n+InAlP Window | |
| Layer 10 | | p++GaAs cap layer | n++GaAs cap layer | |

Notes:
1. Est Crs Struc refers a layer that establishes a crystal structure.
2. Tj designates a tunnel junction.
3. InGaP refers to a compound InxGa(1 − x)P, where x = 0.48, which lattice matches GaAs.
4. InAlP refers to a compound InxAl(1 − x)P, where x = 0.48, which lattice matches GaAs
5. P type materials will typically be doped with about 1E17 cm−3 of Zn, p+ up to 1E18 cm−3, whereas those designated as p++ may be doped to a level of about 5E18 cm−3 Zn.
6. N type materials are doped with Si with the doping range also being in the range of about 1E17 cm−3 to about 5E18 cm−3.
7. A reflector refers to layer at an interface between the base layer and substrate that reflects minority carriers so that recombination losses are minimized.
8. A window refers to a layer adjacent the emitter that allows majority carriers pass to the cap layer and reflects minority carriers to minimize recombination losses.
9. The cap layer is heavily doped so that it is very conductive.

In other embodiments the GaAs substrate is replaced by a Germanium substrate. Growth of high quality GaAs films onto Ge requires the growth of a nucleation layer on the Ge. The general approach involves the growth of a GaAs at a relatively low temperature (LT) of about 550 C followed by growth of GaAs at a temperature more commonly used for GaAs, namely about 700 C. Growth of the LT GaAs leads to a relatively smooth GaAs layer which improves subsequent growth of the high temperature GaAs layer. In order to reduce the generation of anti-phase boundaries, which can lead to recombination centers, off-oriented Ge(001) substrates are used for growth of the low temperature GaAs layer. Although modifications of this approach have been developed, growth of GaAs nucleation layers resulting in high quality GaAs films on Ge substrates usually involve these two features: use of off-oriented Ge(001) substrates and the LT film of GaAs.

In general layers in structures based on Ge substrates parallel those grown on GaAs substrates. Both n- and p-type Ge substrates are used and both types of substrates must first have nucleation layers grown in order to achieve the growth of high quality GaAs films.

However, one unique feature must be dealt with when growing on p-Ge substrates. Growth of As- and P-containing films on p-Ge substrates results in the formation of an n-type layer on the surface of the Ge substrate. To counter the formation of this artifact layer, the first layer grown on the p-Ge substrate is heavily doped p-GaAs. This GaAs layer thus serves two purposes, it establishes a GaAs crystalline structure and the large Zn doping level (about 1E18 to about 5E18) mitigates the potential problem presented by the possible formation of an n-type layer on the p-type Ge substrate. In both cases of n- and p-type Ge substrates, Structures based on InGaP, In(AlGa)P and InAlP grown on Ge substrates are summarized in Tables 4, 5 and 6.

TABLE 4

| InGaP Cells on Ge Substrates | | | | |
|---|---|---|---|---|
| | p-Ge Substrates | | n-Ge Substrates | |
| | n/p InGaP | p/n InGaP | n/p InGaP | p/n InGaP |
| Layer 1 | p-Ge Sub | p-Ge Sub | n-Ge Sub | n-Ge Sub |
| Layer 2 | p+GaAs (Nucl Layer) | p+GaAs (Nucl Layer) | n-GaAs (Nucl Layer) | n-GaAs (Nucl Layer) |
| Layer 3 | p+GaAs (Est Crs Struc) | p+GaAs (Est Crs Struc) | n-GaAs (Est Crs Struc) | n-GaAs (Est Crs Struc) |
| Layer 4 | p InAlP (Reflector) | p++GaAs (p-layer TJ) | n++GaAs (n-layer TJ) | n InAlP (Reflector) |
| Layer 5 | pInGaP (base) | n++GaAs (n-layer TJ) | p++GaAs (p-layer TJ | nInGaP (base) |
| Layer 6 | InGaP (i-Layer) | nInAlP (Reflector) | pInAlP (Reflector) | InGaP (i-Layer) |
| Layer 7 | nInGaP (emitter) | nInGaP (base) | pInGaP (base) | pInGaP (emitter) |
| Layer 8 | nInAlP (Window) | InGaP (i-layer) | InGaP (i-layer) | pInAlP (Window) |
| Layer 9 | n+GaAs cap Layer | pInGaP (emitter) | nInGaP (emitter) | p+GaAs cap Layer |
| Layer 10 | | pInAlP Window | nInAlP Window | |
| Layer 11 | | p+GaAs cap layer | n+GaAs cap layer | |

Notes:
1. Est Crs Struc refers to a layer for establishing the crystal structure.
2. Nucl Layer refers to nucleation layer as discussed elsewhere herein.
3. Layer 3 for the structures grown on p-Ge substrates is doped with Zn to a level of about 1E18 cm−3 to prevent formation of an artifact n-layer. The layer also establishes the GaAs crystal structure. For the p-Ge substrate and the n/p InGaP embodiment it may not be necessary to dope layer 3 to a p+ level, as a lower doping may be sufficient to establish the crystal structure without having to counteract the effects of the artifact layer.
4. Tj designates a tunnel junction
5. InGaP refers to a compound InxGa(1 − x)P, where x = 0.48, which lattice matches GaAs.
6. InAlP refers to a compound InxAl(1 − x), where x = 0.48, which lattice matches GaAs
7. P materials will typically be doped with about 1E17 cm−3 of Zn, p+ up to about 1E18 cm−3, whereas those designated as p++ may be doped to a level of about 5E18 cm−3 with Zn.
8. N materials are doped with Si with the doping range of about 1E17 cm−3 to about 5E18 cm−3.
9. A reflector layer refers to layer at an interface between the base layer and substrate that reflects minority carriers so that recombination losses are minimized.
10. A window layer refers to a layer adjacent the emitter that allows majority carriers to pass to the cap layer and reflects minority carriers to minimize recombinations.
11. The cap layer is heavily doped so that it is very conductive.

TABLE 5

In(AlGa)P Cells on Ge Substrates

| | p-Ge Substrates | | n-Ge Substrates | |
|---|---|---|---|---|
| | n/p In(AlGa)P | p/n In(AlGa)P | n/p In(AlGa)P | p/n In(AlGa)P |
| Layer 1 | p-Ge Sub | p-Ge Sub | n-Ge Sub | n-Ge Sub |
| Layer 2 | p+GaAs (Nucl Layer) | p+GaAs (Nucl Layer) | n-GaAs (Nucl Layer) | n-GaAs (Nucl Layer) |
| Layer 3 | p-GaAs (Est Crs Struc) | p-GaAs (Est Crs Struc) | n-GaAs (Est Crs Struc) | n-GaAs Est Crs Struc) |
| Layer 4 | pInAlP (Reflector) | p++GaAs (p-layer TJ) | n++GaAs (n-layer TJ) | nInAlP (Reflector) |
| Layer 5 | pIn(AlGa)P (base) | n++GaAs (n-layer TJ) | p++GaAs (p-layer TJ) | nIn(AlGa)P (base) |
| Layer 6 | In(AlGa)P (i-Layer) | nInAlP (Reflector) | pInAlP (Reflector) | In(AlGa)P (i-Layer) |
| Layer 7 | nIn(AlGa)P (emitter) | nIn(AlGa)P (base) | pIn(AlGa)P (base) | pIn(AlGa)P(emitter) |
| Layer 8 | nInAlP (Window) | In(AlGa)P (i-layer) | In(AlGa)P (i-layer) | pInAlP (Window) |
| Layer 9 | n+GaAs cap Layer | pIn(AlGa)P (emitter) | nIn(AlGa)P (emitter) | p+GaAs cap Layer |
| Layer 10 | | pInAlP Window | nInAlP Window | |
| Layer 11 | | p+GaAs cap layer | n+GaAs cap layer | |

Notes:
1. Est Crs Struc refers to a layer to establish crystal structure
2. Nucl Layer refers to nucleation layer as discussed elsewhere herein.
3. Layer 3 for the structures grown on p-Ge substrates is doped with Zn to a level of about 1E18 cm−3 to prevent formation of the artifact n-layer. The layer also establishes GaAs structure.
4. Tj designates a tunnel junction
5. InGaP refers to a compound InxGa1 − xP (x = 0.48), which lattice matches GaAs.
6. In(AlGa)P refers to a compound Inx(AlyGa(1 − y))(1 − x)P, where x = 0.48 and y = .2, which lattice matches GaAs.
7. P type materials will typically be doped with about 1E17 cm−3 of Zn, p+ up to about 1E18 cm−3, whereas those designated as p++ may be doped to a level of about 5E18 cm−3 Zn.
8. N type materials are doped with Si with the doping range being in the range of about 1E17 cm−3th about 5E18 cm−3.
9. A reflector layer refers to layer at an interface between the base layer and a substrate that reflects minority carriers so that recombination losses are minimized.
10. A window layer refers to a layer adjacent the emitter that allows majority carriers pass to the cap layer and reflects minority carriers to minimize recombination losses.
11. The cap layer is heavily doped so that it is very conductive.

TABLE 6

InAlP Cells on Ge Substrates

| | p-Ge Substrates | | n-Ge Substrates | |
|---|---|---|---|---|
| | n/p InAlP | p/n InAlP | n/p InAlP | p/n InAlP |
| Layer 1 | p-Ge Sub | p-Ge Sub | n-Ge Sub | n-Ge Sub |
| Layer 2 | p+GaAs (Nucl Layer) | p+GaAs (Nucl Layer) | n-GaAs (Nucl Layer) | n-GaAs (Nucl Layer) |
| Layer 3 | p+GaAs (Est Crs Struc) | p+-GaAs (Est Crs Struc) | n-GaAs (Est Crs Struc) | n-GaAs (Est Crs Struc) |
| Layer 4 | p+InAlP (Reflector) | p++GaAs (p-layer TJ) | n++GaAs (p-layer TJ) | n+ InAlP (Reflector) |
| Layer 5 | p InAlP (base) | n++GaAs (n-layer TJ) | p++GaAs (n-layer TJ) | nInAlP (base) |
| Layer 6 | InAlP (i-Layer) | n+InAlP (Reflector) | p+InAlP (Reflector) | InAlP (i-Layer) |
| Layer 7 | nInAlP (emitter) | nInAlP(base) | pInAlP (base) | pInAlP (emitter) |
| Layer 8 | n+InAlP (Window) | InAlP (i-layer) | InAlP (i-layer) | p+InAlP (Window) |
| Layer 9 | n+GaAs cap Layer | pInGaP (emitter) | nInAlP (emitter) | p+GaAs cap Layer |
| Layer 10 | | p+InAlP Window | n+InAlP Window | |
| Layer 11 | | p+GaAs cap layer | n+GaAs cap layer | |

Notes:
1. Est Crs Struc refers to a layer to establish crystal structure
2. Nucl Layer refers to a nucleation layer as discussed in elsewhere herein.
3. Layer 3 for the structures grown on p-Ge substrates is doped with Zn to a level of about 1E18 cm−3 to prevent formation of an artifact n-layer. The layer also establishes GaAs structure.
4. Tj designates tunnel junction
5. InGaP refers to a compound InxGa(1 − x)P, where x = 0.48, which lattice matches GaAs.
6. InAlP refers to a compound InxAl(1 − x), where x = 0.48, which lattice matches GaAs
7. P type materials will typically be doped with about 1E17 cm−3 of Zn, p+ up to about 1E18 cm−3, whereas those designated as p++ may be doped to a level of about 5E18 cm−3 Zn.
8. N type materials are doped with Si with the doping range also being in the range of about 1E17 cm−3 to about 5E18 cm−3.
9. Reflector refers to layer at an interface between the base layer and the substrate that reflects minority carriers so that recombination losses are minimized.
10. A window refers to a layer adjacent the emitter that allows majority carriers pass to the cap layer and reflects minority carriers to minimize recombination losses.
11. The cap layer is heavily doped so that it is very conductive.

It should be noted that in one embodiment a betavoltaic cell may be grown on each side of the semiconductor substrate. For instance, for either GaAs or Ge substrates a combination of a p/n and n/p betavoltaic structure (e.g. InGaP, InAlP, InAlGaP or others) may be grown on opposing sides of the substrate to create a bilateral betavoltaic structure (i.e. double-side betavoltaic structure) yielding twice the voltage of a single-sided counterpart. Just as in the case of a single-sided betavoltaic, each side of the bilateral cell will require a source of beta flux impinging on the respective junctions. The use of tunnel junctions may be required to allow the current to flow in a series arrangement between the two betavoltaic cells.

In one embodiment of the present invention, the tritium source is a tritium metal hydride (sometimes referred to as a metal tritide), that is in contact with the top surface of the betavoltaic structure as shown in FIG. 1. The metal tritide may be formed by depositing one or a combination of hydride forming metals (e.g. scandium, titanium, magnesium, palladium, lithium etc.). Thicknesses of the metal tritide layer are typically less than one micron and can be as thin as 50-100 nanometers. The metal layer may be placed on top of the betavoltaic cell by directly depositing on top of the betavoltaic cell's active area (e.g. window or cap layer) through methods known in the art (e.g. evaporation, electro deposition etc.). Alternatively, the metal tritide layer may be deposited on a separate thin substrate (e.g. ~25 microns to ~500 microns or in the millimeter thickness range) that is mechanically connected to the betavoltaic cell's active area via pressure, epoxy or spot welding. The metal tritide is typically formed by exposure to tritium gas at pressures ranging 0.25 to 20 Bar and temperatures ranging approximately 100° C. to 600° C. for durations ranging minutes to days. A layer of palladium ranging from approximately 1 nanometer to 500 nanometers may be deposited over (i.e. capping-off) a scandium, titanium, magnesium or lithium metal or other tritide forming metal in order to reduce the tritium loading temperature and stabilize the tritium within the metal matrix after the tritide has been formed. The metal tritide layer may also be formed by an in-situ evaporation of the metal in the presence of tritium. Bi-directional metal tritide sources (i.e. with betas emanating from opposing surfaces) may be utilized in this invention. For example, the metal tritide may be formed as a film on top of the betavoltaic cell's active area allowing for a second cell to be place in direct contact with its active area as in FIGS. 6-7.

In another embodiment of the present invention the contact lines on the top surface of the betavoltaic homojunction can be very thin and on the perimeter of the semiconductor. This contact ring is used to collect the current from the semiconductor while providing a minimal shadowing effect to the radioactive source's beta flux that impinges on the surface of the semiconductor. The contact ring for the betavoltaic semiconductor may be formed in the same manner as solar cell industry uses to make contact gridlines on the solar cell semiconductor. However, the betavoltaic cell contact ring is substantially different from a solar cell where a series of gridlines are uniformly covering the surface of the semiconductor and can cover approximately 5-10% of the semiconductor surface. This uniform coverage creates a shadowing effect resulting in a proportional loss of power from the solar cell. In contrast the betavoltaic cell's contact ring may be reduced to a small perimeter (e.g. outlining a 1 cm×1 cm cell or 3 cm×3 cm cell etc.) or it may be just a set of contact points or lines. This configuration may be necessitated by the low magnitude of current collected from the betavoltaic device that is in the nanoamp to microamp per square centimeter range as opposed to solar cells where the range is more in the milliamp per square centimeter range. Thus, whereas solar cells require relatively low series resistance (<1 ohm per square centimeter of cell area) by the inclusion of more contact line coverage, betavoltaic cells can function efficiently with much greater values of series resistance.

In yet another embodiment of this invention a thin GaAs cap layer is grown to a desired thickness (e.g. 50-100 Å or less) and uniformly covers the betavoltaic window. In this configuration, the contact metal gridlines for current collection are replaced with a tritium metal tritide deposited uniformly over the GaAs cap layer. In this configuration, the tritium metal tritide serves as both a metal contact collector and a beta-source emitter resulting in less shadowing of betas impinging on the betavoltaic cell and a simpler construction of the betavoltaic cell.

As an example, the contacts in a betavoltaic semiconductor can result in a shadow coverage that is much less than about 1%, thereby providing a higher efficiency betavoltaic battery. Specific shadow coverage and thicknesses of contact ring, lines or dots required by a betavoltaic semiconductor is dictated by consideration of sheet conductance of the top surface cell layers, namely, the cap, window and emitter layers. As noted above, the sheet resistance for a tritium betavoltaic cell can be relatively large (e.g. >100 Ohms per square centimeter).

In all embodiments of the present invention it may be desirable to shield the edges of the betavoltaic structure from beta particles. This constitutes another novel aspect of the present invention. As is known in the art, if the energy of a beta particle is large enough, the particle can cause the displacement of an atom in a crystalline semiconductor. Atomic vacancies can act as a recombination center for EHPs in semiconductors and can cause degradation of betavoltaic efficiencies. Fortunately, the threshold for atomic displacement in semiconductors is typically greater than 250 keV. Therefore, tritium beta particles as well as beta particles from Promethium-147 and Nickel 63 do not cause degradation of semiconductor diode properties as a result of beta absorption within the bulk of the material. However, low energy betas can create dangling bonds along the junction periphery, which can cause shunting currents or carrier recombination at the junction edges. If the edges are not properly shielded or protected from the beta flux, the betavoltaic device performance/efficiency may degrade.

As illustrated in FIGS. 4-7, the junction edges may be protected by the keeping the tritium source within the perimeter contact metal gridlines at a distance such that the beta particle cannot reach the edges of the semiconductor. Furthermore, the metal perimeter contact gridlines act as a physical barrier to the beta flux, thus preventing the beta particles from hitting the edge of the device. It should be understood that protection of the edges may be accomplished through a variety of means such as all forms of physical barriers (e.g. deposited metal barriers, polymers, insulators etc.) or simply physical distance acting as a barrier to beta particles impinging on the betavoltaic semiconductor's edges.

In all embodiments of the present invention, the voltage and current may be scaled up via the stacking of betavoltaic semiconductors and tritium sources (betavoltaic cells). Betavoltaic cell layers may be stacked vertically or arranged horizontally and configured electrically in series or parallel. Electrical connection can be established by utilizing through-vias as power lead contacts across betavoltaic cell layers, by using current-channeling interposers (e.g. flexible circuit cards) in between betavoltaic cells or groups of cells, or by many other methods common in the art. It should be noted that varying stacking configurations produce varying voltage and current outputs from the betavoltaic composite device as illustrated in the approaches to connecting betavoltaic cells in series and parallel configurations in FIGS. 4-7. Arranging multiple (N) layers of n/p cells in series with unidirectional beta sources is illustrated in FIG. 4. If it is assumed that all cells have identical properties, namely, the same values for short circuit current ($I_{sc}$), open circuit voltage ($V_{oc}$) and maximum power ($P_{max}$), and assuming the contacts between devices are ideal, the characteristics for the series stack of N cells are:

$$(I_{sc})_{stack}=I_{sc},(V_{oc})_{stack}=N\times V_{oc},\text{ and }(P_{max})_{stack}=N\times P_{max}$$

Electrical connection between cells can be established by a soft metal such as indium or a deposited peripheral strip of gold or another appropriate metal. Electrical contact can be made by contact pressure between metals, solders, electrically conductive epoxies, and other methods well known in the art. FIG. 4 describes an approach where the electrical connections are made on the periphery of cells. Although n/p cells are shown in FIG. 4, the same approach can be used for p/n cells.

FIGS. 5A and 5B illustrate a novel approach for combining n/p and p/n cells in series with bidirectional beta sources, i.e. sources that emit beta particles in two directions as shown. This approach allows for the efficient use of a tritium layer in a bidirectional capacity. Contacts can be formed as discussed above for the series stack. If the cells have identical properties, except for polarity, the two cell unit provides:

$$(Isc)\text{unit}=Isc, (Voc)\text{unit}=2\times Voc \text{ and } (P\max)\text{unit}=2\times P\max$$

FIGS. 6A and 6B illustrate a configuration for combining two n/p (or p/n) cells in parallel and coupled to a bidirectional source. In this case, characteristics of the two cell unit are:

$$(Isc)\text{unit}=2\times Isc, (Voc)\text{unit}=Voc \text{ and } (P\max)\text{unit}=2\times P\max$$

An example where cells are arranged in a stack but connected in parallel electrically is depicted in FIG. 7 where such a structure of n/p (or p/n) cells are each coupled to unidirectional beta sources. Assuming there are N identical cells, each having Isc, Voc, and Pmax as cell parameters, $$(I_{sc})_{stack}=N\times I_{sc}, (V_{oc})_{stack}=V_{on}, \text{ and } (P_{max})_{stack}=N\times P_{max}$$

Joining methodologies of electronic component stacking (e.g., multi-chip stacking) such as, solder connections, wire bonding, and other conductive adhesive materials and techniques, can be utilized to join combinations of the configurations listed in FIGS. 4-7. This allows for a broad variety of design interconnectability, thus achieving betavoltaic batteries with a variety of current and voltage specifications.

An embodiment of the present invention includes a method of hermetically sealing a direct conversion semiconductor battery with a tritium metal hydride source at low temperatures. During construction of the battery and sealing there is no leakage of tritium from the metal hydride due to high temperature sealing methods, such as glass frit seals or solder seals, and it poses no risk of tritium exposure to the operator sealing the battery. Additionally, the hermetic battery design and the sealing method allow for high throughput manufacturing and low contamination of tritium within the manufacturing facility.

Hermetic packaging and sealing techniques for integrated circuits are widely used in the semiconductor industry to prevent dirt, moisture, particulates and ionic impurities from entering the integrated circuit package and causing corrosion of the circuit elements and interconnects. In an embodiment of the present invention a combination of these techniques and packaging designs prevents tritium from exiting the battery package. That is, the role of hermetic packaging and sealing for integrated circuits is reversed in the case of the tritium battery, from contamination entering the IC package to preventing radioactive contamination from exiting the tritium battery package.

In this embodiment of the present invention, the battery package is comprised of a ceramic or metal package housing containing electrode pins or leads from an internal area of the package to an external area of the package. These leads serve as conduits of electrical power for the battery and are connected to a load on a circuit board or other device. The leads are hermetically attached and sealed via glass frits or commonly used techniques for hermetic sealing of leads. Although the lead sealing methods involve high temperature processes above 300° C., the leads are sealed on the battery housing prior to containment of the tritium metal hydride. Note, the package may take any form currently in use for IC packages, i.e. PIN device leads, leadless package, surface mounts, etc.

The direct conversion semiconductor is placed or bonded within the ceramic or metal package and is connected to internal areas of the leads via wire bonds or other commonly used techniques. The tritiated metal hydride source, comprising either scandium or titanium or another suitable metal, is placed in contact with the direct conversion semiconductor. A combination of direct conversion semiconductors and tritium metal hydride source layers in series or parallel may be connected within the package. Additionally, the tritium metal hydride source layers may be deposited directly onto the direct conversion semiconductor. Also, the direct conversion semiconductors may be formed as epilayers that are approximately 5-50 microns in thickness.

In one embodiment, the present invention uses a Kovar lid or Kovar step lid that closes the tritium battery package. If a ceramic package is used a side brazed Kovar seal ring must be attached using techniques commonly known in the art. Note, the Kovar seal ring is attached prior to inserting the tritiated metal hydride.

Figure 8A:
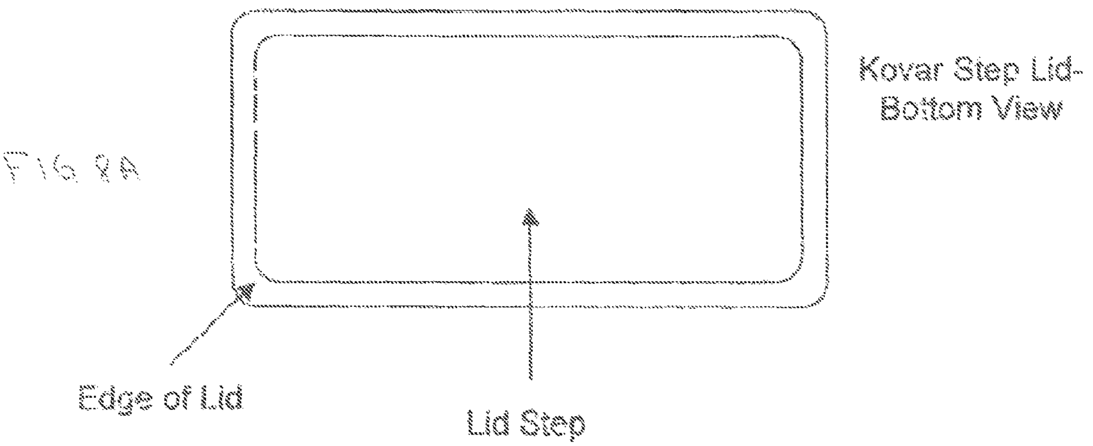
FIGS. 8A and 8B illustrate a seal lid for use with the device of the present invention.
Figure 8B:
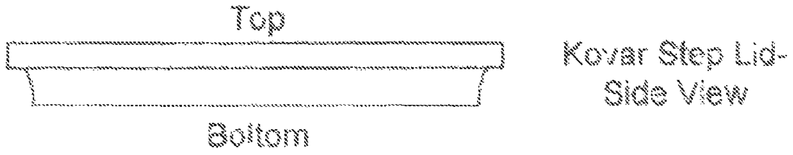

The final step in completion of the betavoltaic is the sealing of the Kovar step lid to the metal package or the ceramic side brazed package with a Kovar seal ring. See FIGS. 8A (bottom view) and 8B (side view). FIG. 8A illustrates a lid step and a lid edge. The Kovar lid is sealed with a resistance or laser welder that uses localized heating well below 200° C. to hermetically weld the lid to the package. The preferred method for welding is a parallel seam welder, which is inexpensive compared to laser welding and offers a high throughput. Note, the most common method in the IC industry for hermetic sealing is the solder weld using a belt furnace. This method involves temperatures of approximately 360° C., well above the threshold for tritium containment.

Testing of the tritium battery package seal is achieved by enclosing the parallel seam-sealer and the unsealed tritium battery package within a helium glove box environment. Helium is flowed across the unsealed package and the Kovar lid is then placed on the package. The sealing is performed under a helium atmosphere enclosing a helium environment within the tritium battery package. The tritium battery package is then placed in an ultra-sensitive helium detector with detection levels up to 10^-11 cc/second under a 1 atmosphere differential. A leak rate of 10^-8 cc/second under a 1 atmosphere differential is considered hermetic for the tritium battery package and easily achieved using the above method. Additionally, lower hermiticity requirements are still acceptable as long as tritium leakage is within acceptable regulatory limits.

There are benefits to the operation and longevity of the betavoltaic device that are directly derived from sealing the device in an inert atmosphere. Namely, the prevention of oxidation or corrosion reactions involving both the weld joint between the lid and package, as well as oxidation that forms on the surfaces of the actual components of the betavoltaic device can be mitigated. Elimination of trapped oxygen and humidity though the use of a ultra-high-purity, very low humidity, inert gas prevents the possibility for generating an oxide product in the weld seal, which would produce an opportunity for tritium leakage out of the package, or humidity and oxygen leakage into the package.

Another approach to testing of the hermetic seal may be achieved with a helium bombing system where the tritium battery package is enclosed in high-pressure helium environment. Depending on the size of the leaks within the tritium battery package the helium gas will enter the package. The package is then removed from the high-pressure environment and inserted in the ultra-sensitive helium detector unit to detect leakage rates.

In another embodiment the containment of tritium and radiation emanating from the tritium metal hydride is contained within individualized tritiated direct-conversion semiconductor dies or epilayer dies. These direct-conversion dies and tritium metal hydrides can be supplied with appropriate encapsulation that serves to contain radiation. Encapsulation in the form of discrete, conformal coatings that can be applied through numerous techniques, such as dipping/immersion process, chemical/physical vapor deposition techniques, (e.g. potting, sputtering, evaporation, etc.). These coatings are applied as thin films and can be metallic or vitreous in nature, providing some modest structural support and robustness to the direct conversion dies, while still providing an important, necessary, and effective barrier to the emission of beta particles arising from tritium decay and containment of the tritium radioisotope. Encapsulation is conducted to safeguard against any radiation leakage, but would be accomplished in a conformal manner so as to leave contact leads exposed as necessary for integration into device housings and maintain geometric requirements for the dies. These dies thusly encapsulated are then facile candidates for regulatory general and/or exempt licensure; in this manner, the encapsulated materials could easily be transported or handled without any risk of radiation exposure and without any need for specialized radiation materials training. For example, the encapsulated tritium betavoltaic dies could be shipped to an OEM integrator for inclusion in an integrated circuit package without a hermetic seal.

One aspect of the present invention involves increasing the surface area per unit volume in a direct conversion device without increasing the dark current, via a texturing method. Instead of texturing a surface of the betavoltaic semiconductor, an epitaxial liftoff (ELO) process is employed to remove an intact epilayer containing the betavoltaic semiconductor device. The ELO process used may be any of the techniques known to those skilled in the art. This epilayer can be made substantially free of surface defects that may harm the betavoltaic device and thus increase dark current of the device. The epilayer is approximately 0.1 microns to 5.0 microns thick, but can be as thick as 50 microns, and is usually coupled to a backing layer that may comprise a metallic layer (e.g. gold, copper, aluminum, titanium, scandium, platinum, silver, tungsten, and other alloys) or a polymer material (e.g. polyimide, Kapton, etc.). The composite epilayer, comprising the epilayer and backing layer, is approximately 5-50 microns, or as thick as 100 microns, and is flexible. Conversely, the backing layer may serve a dual purpose as a metal tritide that can approximately double the creation of EHPs within betavoltaic epilayer. This is due to the nascent thinness of the device and the high diffusions lengths of the charge carriers in InGaP and other III-V structures allowing for betavoltaic operation for betas entering through the base layer. Moreover, a metal tritide that is formed on both sides of a betavoltaic epilayer provides for a symmetric distribution of forces under thermal expansion providing structural integrity to the betavoltaic epilayer. As described previously, the metal tritide can also be sealed with barrier layers (e.g. metallic, polymer, semiconductor, ceramic etc.) preventing the diffusion or migration of tritium or tritium species out of the metal tritide and providing shielding against radiation emanation.

Furthermore, the composite epilayer and tritium metal hydride (i.e., betavoltaic epilayer dies) comprises a thin betavoltaic device that may be stacked in series or parallel configurations as described in the teachings of the various embodiments of the invention. A single composite epilayer and tritium metal hydride can be as thin as 1 to 10 microns and have an approximate power range of 0.1 to 0.2 microwatts. Furthermore, via stacking of these individual layers the power density can reach as high as 100-2000 microwatts/cm^3, thereby achieving an increase in surface area per unit volume resulting in a significant increase in power per unit volume.

In one embodiment the tritium metal hydride film may be deposited directly on one or both sides of the tritium betavoltaic epilayer. In another embodiment, the tritium metal hydride may be formed on a separate thin substrate or thin foil (e.g. less than 100 microns thick) and is physically attached to the composite epilayer containing the betavoltaic device.

In one embodiment, the betavoltaic epilayer is comprised of a III-V semiconductor with a betavoltaic semiconductor device structure. The betavoltaic structure may have any of the constructions or combinations described herein. For example, the betavoltaic epilayer may have a p/n or n/p structure with or without a highly doped base, a Cap layer to protect the device from oxidation. The betavoltaic epilayer with a betavoltaic device in its structure may be selectively etched/released from the III-V substrate via an intermediary sacrificial layer (e.g. AlGaAs, AlAs) as is known in the art. The sacrificial layer can have a thickness ranging from about 1 nm to about 200 nm. Once the sacrificial layer has been removed via etching, the epilayer and backing layer together are released. In doing this, the betavoltaic device thickness is reduced from standard semiconductor wafer thickness to less than 50 micron thickness. Furthermore, a cost reduction occurs due to the fact that the substrate may be reused to grow another epilayer, thereby reducing the cost of the base substrate material of the semiconductor device. Other methods of releasing the betavoltaic epilayer include etching the substrate with an etch-stop near the betavoltaic epilayer structure or wafer thinning using methods known in the art (e.g. grinding and polishing).

It should be understood that any III-V direct conversion device may be formed into an epilayer through this liftoff process by utilizing a selective etch process to release the epilayer. Conversely, the epilayer may be released by etching away the substrate completely while leaving the epilayer intact. This may be accomplished by using a selective etch process that terminates or slows down near an etch-stop adjacent to the betavoltaic epilayer. Similarly, the substrate may be grinded and polished up to or near the betavoltaic epilayer.

It should be noted that in both the case of releasing the betavoltaic epilayer via a selective etch of a sacrificial layer and when completely etching away the substrate, the substrate may be undoped/insulating. Typically, the substrate is doped in order to make a back contact to the betavoltaic cell, but in the case of a betavoltaic epilayer the contact may be directly made to the released betavoltaic epilayer either through a metal contact or a metal tritide acting as a contact that is connected to a doped back surface field or a doped buffer layer. The use of undoped/insulating substrates can offer a further cost reduction over doped counterpart substrates.

The various embodiments of the present invention allow construction of a single flexible epilayer tritium betavoltaic battery or a very thin betavoltaic battery involving a stack of tritium betavoltaic epilayer cells stacked in either a series or parallel electrical configuration. For example a thin epilayer tritium betavoltaic battery may be constructed with either the tritium metal hydride film connected to the epilayer or directly deposited on the epilayer. A thin betavoltaic epilayer battery may be connected to a lithium ion thin film battery available from companies such as Front Edge Technologies of Baldwin Park, Calif., Cymbet Corporation of Elk River, Minn. or Infinite Power Solutions from Littleton, Colo. These two batteries may be connected together as a joint film that may be pasted within an integrated circuit package to run the device periodically via power bursts from the lithium thin film battery. The tritium epilayer betavoltaic battery can trickle charge the lithium ion film battery. Periodically the film battery can discharge power bursts at milliwatt power levels and then be recharged via the trickle charging by the tritium epilayer betavoltaic battery.

The tritium epilayer battery, due to its thinness and flexibility, may be inserted into the conformal coating of an integrated circuit and power the integrated circuit stealthily. It can also be combined with a lithium ion thin film battery into the conformal coating of an integrated circuit as a source of power for the integrated circuit. The tritium epilayer battery can also be placed within an integrated circuit's package, multi-chip-module or printed circuit board.

Another approach of the present invention involves texturing the tritium metal hydride substrate to increase the surface area of the deposited tritium. Using this method, the substrate is textured to produce surface roughness and then a suitable metal (e.g. palladium, titanium, scandium) for tritium capture into the metal hydride deposited on the surface. Texturing the tritium metal hydride substrate rather than the semiconductor in the betavoltaic device may avoid creating defects on the semiconductor's surface that result in a high dark current and poor efficiency.

The textured tritium metal hydride source is then placed in direct contact with the smooth semiconductor device's surface resulting in a higher density of tritium beta flux entering the semiconductor device. Note the tritium may be deposited on the textured substrate via any means known in the art. Some examples include aerogels and polymers that may be deposited directly onto the textured substrate surface.

In one embodiment, a silicon substrate's surface is textured using a potassium hydroxide (KOH) etchant as is known in the art for texturing silicon solar cells to prevent reflection of sunlight. In this embodiment, square-based pyramids with approximately 10 micron tall peaks, as measured from the base, are formed on the surface. The resulting surface area is 1.8 times the original planar surface. As mentioned elsewhere herein, a suitable metal is then deposited on the surface with a thickness of approximately 0.1 to 1 micron and then treated with tritium. The metal to be tritiated is then deposited using methods known in the art. This results in a tritium metal hydride with increased surface area on a stainless steel surface.

In another embodiment, a metal substrate (e.g. stainless steel or titanium) surface is mechanically roughened. Conversely, periodic triangular rows are grated through the surface via a laser or other suitable method that can increase the surface area. Note, if triangular rows are formed where the triangles are equilateral in nature, the surface can reach twice the surface area of the original planar surface. A tritiated metal hydride is then formed on the substrate.

Some of the most secure processors and field programmable gate arrays (FPGA's) are using SRAM memory to store encryption keys. However current battery technologies depend on chemistries that are unreliable over long periods of time (i.e. several years) especially under wide temperature ranges, such as −55° C. to +125° C.

The tritium betavoltaic batteries of the present invention are able to power the SRAM memory for periods of 15-20 years or more through these extreme temperatures. Note, the voltage of tritium betavoltaic batteries based on III-V compounds will fluctuate less in higher temperatures than silicon-based betavoltaic devices.

The tritium based betavoltaic batteries of this invention allow soldier-to-base wireless communications and computer-to-base communication to be encrypted using FPGA's with encryption keys stored in SRAM as well as defense and telecom applications that experience a wide range of temperatures. Note, the tritium betavoltaic batteries are hermetically sealed batteries packaged in surface mount packages that may be soldered to circuit board with the FPGA's Another application of tritium based betavoltaic batteries of the present invention is for supplying power to anti-tamper volume protection for electronics and other devices that require protection from intruders. These type of batteries provide the critical longevity of more than 10 years for anti-tamper protection. Note, the temperature resilience of these batteries is critical to the longevity and reliability. In one embodiment a volume protection membrane from W. L. Gore is used on a circuit card to protect encryption keys stored in SRAM from a reverse engineering attack. The tritium betavoltaic batteries of this present invention may be hermetically sealed in a surface mount package and soldered on the circuit board to provide power to both the volume protection device, the anti-tamper trigger in the processor and the encryption keys held in SRAM. If an attack occurs on the volume protection device (i.e., W. L. Gore volume protection membrane), the tritium betavoltaic battery power allows the volume protection device to detect the attack and the anti-tamper trigger will erase all critical information residing in the electronics, including the encryption keys.

Various layers are described herein as having a p-type dopant or an n-type dopant. Those skilled in the art recognize that the dopant types can be reversed (n-type doped layers replaced with p-type and p-type doped layers replaced with n-type) and the device will provide the same functionality. Also, certain embodiments have been described as having an intrinsic layer; depending on the dopant types, doping levels, and other factors, this intrinsic layer may not be required in all embodiments. In the Tables the intrinsic layer is referred to as the "i-layer."

This written description uses examples to disclose the invention, including the best mode, and also to enable any person skilled in the art to make and use the invention. The scope of the invention may include other examples that occur to those skilled in the art. Such other examples are intended to be within the scope of the claims if they have structural elements that do not differ from the literal language of the claims, or if they include equivalent structural elements with insubstantial differences from the literal languages of the claims.

In addition to the described embodiments and the layers comprising those embodiments, it should be noted that other embodiments of the invention may comprise one or more material layers from one of the described embodiments used with one or more material layers from other ones of the described embodiments.

What is claimed is:

1. A device for producing electricity, comprising:
a germanium substrate doped a first dopant type;
a plurality of stacked material layers extending from the substrate, further comprising:
a base layer doped the first dopant type;
an emitter layer doped the second dopant type;
a window layer having a lattice structure matched to the lattice structure of the emitter layer and doped the second dopant type; and
a beta particle source for generating beta particles;
wherein the plurality of stacked material layers further comprise an InAlP reflector layer doped the first dopant type and disposed between the substrate and the base layer.

2. The device of claim 1 wherein the plurality of stacked material layers further comprises a GaAs layer doped the first dopant type and disposed between the substrate and the base layer for serving as a nucleation layer or as a layer for establishing the crystal structure.

3. The device of claim 1 wherein the plurality of stacked material layers further comprise an intrinsic InGaP layer disposed between the base layer and the emitter layer.

4. The device of claim 1 further comprising a physical barrier for shielding edges of the plurality of stacked material layers from the beta particles.

5. A device for producing electricity, comprising:
a germanium substrate doped a first dopant type;
a plurality of stacked material layers extending from the substrate, further comprising:
a base layer doped the first dopant type;
an emitter layer doped the second dopant type;
a window layer having a lattice structure matched to the lattice structure of the emitter layer and doped the second dopant type; and
a beta particle source for generating beta particles;
wherein the plurality of stacked material layers further comprise a GaAs cap layer doped the second dopant type and having a higher doping level than the emitter layer, the GaAs cap layer disposed between the window layer and the beta particle source.

6. The device of claim 5 wherein the bandgap of the window layer is greater than the band gap of the emitter layer.

7. The device of claim 5 wherein the first dopant type comprises a p dopant type and the second dopant type comprises an n dopant type or wherein the first dopant type comprises an n dopant type and the second dopant type comprises a p dopant type.

8. The device of claim 5 wherein a material of the window layer comprises one of InAlP, InAlGaP, ZnSe, AlAs, AlAsP, and a pseudomorphic layer.

9. The device of claim 5 wherein a material of the beta particle source comprises one of InAlP, AlGaP, and InGaP, tritium metal hydride and a polymer containing tritium.

10. The device of claim 5 wherein a material of the base layer comprises one of InGaP, In(AlGa)P, and InAlP and a material of the emitter layer comprises one of InGaP, In(AlGa)P, and InAlP.

11. A device for producing electricity, comprising:
a germanium substrate doped a first dopant type;
a plurality of stacked material layers extending from the substrate, further comprising:
a base layer doped the first dopant type;
an emitter layer doped the second dopant type;
a window layer having a lattice structure matched to the lattice structure of the emitter layer and doped the second dopant type;
a beta particle source for generating beta particles; and
a housing, wherein the device is hermetically sealed within the housing.

12. A device for producing electricity, comprising:
a germanium substrate doped a first dopant type;
a plurality of stacked material layers extending from the substrate, further comprising:
a base layer doped the first dopant type;
an emitter layer doped the second dopant type;
a window layer having a lattice structure matched to the lattice structure of the emitter layer and doped the second dopant type;
a beta particle source for generating beta particles; and
a first terminal comprising a contact ring disposed on a surface of the plurality of stacked material layers.

13. A device for producing electricity, comprising:
a germanium substrate doped a first dopant type;
a plurality of stacked material layers extending from the substrate, further comprising:
a base layer doped the first dopant type;
an emitter layer doped the second dopant type;
a window layer having a lattice structure matched to the lattice structure of the emitter layer and doped the second dopant type; and
a beta particle source for generating beta particles;
wherein the substrate is doped a p dopant type, the base layer is doped an n dopant type and the emitter layer is doped the p dopant type, the device further comprising a p dopant type tunnel junction layer adjacent an n dopant type tunnel junction layer disposed between the substrate and the base layer with the p dopant type tunnel junction layer disposed closer to the substrate than the n dopant type tunnel junction layer.

14. A device for producing electricity, comprising:
a germanium substrate doped a p dopant type;
a plurality of stacked material layers extending from the substrate, further comprising:
a GaAs first layer doped the p dopant type;
an InGaP base layer doped the p dopant type;
an InGaP emitter layer doped an n dopant type; and
an InAlP window layer having a lattice structure matched to the lattice structure of the emitter layer and doped the n dopant type;
a GaAs cap layer doped the n dopant type;
an InAlP reflector layer doped the p dopant type and disposed between the substrate and the base layer; and
a beta particle source for generating beta particles.

15. The device of claim 14 wherein the plurality of stacked material layers further comprise an intrinsic InGaP layer disposed between the base layer and the emitter layer.

16. The device of claim 14 wherein the GaAs first layer has a higher doping concentration than the base layer.

17. A device for producing electricity, comprising:
a beta particle source layer for generating beta particles that travel in opposing directions from the beta particle source layer;
a plurality of stacked material layers on each one of two opposing surfaces of the beta particle source layer;

each of the plurality of stacked material layers comprising:
a germanium substrate doped a first dopant type;
a base layer doped the first dopant type;
an emitter layer doped the second dopant type; and
a window layer having a lattice structure matched to the lattice structure of the emitter layer.

18. The device of claim 17 wherein a material of the base layer comprises one of InGaP, In(AlGa)P, and InAlP and a material of the emitter layer comprises one of InGaP, In(AlGa)P, and InAlP.

* * * * *